United States Patent [19]

Tults

[11] 4,245,351
[45] Jan. 13, 1981

[54] AFT ARRANGEMENT FOR A PHASE LOCKED LOOP TUNING SYSTEM

[75] Inventor: Juri Tults, Indianapolis, Ind.

[73] Assignee: RCA Corporation, New York, N.Y.

[21] Appl. No.: 61,956

[22] Filed: Jul. 30, 1979

[51] Int. Cl.³ .............................................. H04B 1/26
[52] U.S. Cl. .................................... 455/182; 455/183; 455/192
[58] Field of Search ............... 455/160, 180, 182, 183, 455/192; 358/191.1, 195.1

[56] References Cited

U.S. PATENT DOCUMENTS

| | | | |
|---|---|---|---|
| 3,821,650 | 6/1974 | Kase et al. | 455/192 |
| 3,980,968 | 9/1976 | Ma | 455/192 |
| 4,031,549 | 6/1977 | Rast et al. | 455/183 |
| 4,078,212 | 3/1978 | Rast | 455/183 |
| 4,123,716 | 10/1978 | Borg | 455/192 |
| 4,130,804 | 12/1978 | Mogi et al. | 455/182 |

OTHER PUBLICATIONS

"A Low Cost, High Performance Digital TV Tuning Systems" by Dreiske, 2/1977, IEEE Transactions on Consumer Electronics.

"An Electronic Design Practical Guide to A/D Conversion, Part 2" by Schmid et al., 12/68, in Electronic Design #26.

Primary Examiner—Jin F. Ng
Attorney, Agent, or Firm—Eugene M. Whitacre; Paul J. Rasmussen; Peter M. Emanuel

[57] ABSTRACT

A phase locked loop tuning system includes a phase comparator for generating pulse error signals having pulses with durations corresponding to the magnitude of a phase and/or frequency deviation between a frequency reference signal and a frequency-divided signal derived from a local oscillator signal. A low pass filter is responsive to the pulse error signals for generating a tuning voltage for controlling a voltage controlled local oscillator to tune standard frequency RF carriers. So that a substantial portion of the tuning system may be incorporated in a single integrated circuit, a pulse converter is provided to convert an analog AFT signal to pulse error signals similar to those generated by the phase comparator but with durations representing the magnitude of a deviation between the frequency of the IF picture carrier and its nominal value. The AFT related pulse error signals are selectively applied to the low pass filter to accommodate the tuning of nonstandard frequency RF carriers. The tuning system may include a duty cycle control unit to control the duty cycle of the AFT related error pulses in accordance with the selected channel so that the sensitivity of the tuning system is more uniform throughout the tuning range.

11 Claims, 5 Drawing Figures

AFT ARRANGEMENT FOR A PHASE LOCKED LOOP TUNING SYSTEM

BACKGROUND OF THE INVENTION

The present invention pertains to the field of tuning systems with automatic fine tuning provisions.

Automatic fine tuning (AFT) arrangements are widely employed in tuning systems for radio and television receivers to correct for errors of the frequency of the local oscillator signal due to variations of the characteristics of components within the tuning system. However, tuning systems which are not particularly susceptible to frequency errors due to component variations can also employ AFT arrangements to correct for frequency offsets in the received signal which may be introduced, for example, by frequency conversion apparatus utilized with cable and master antenna installations. Thus, tuning systems which include a phase locked loop (PLL) for synthesizing a local oscillator signal from a relatively stable frequency reference signal generated by a crystal oscillator arrangement often also include an AFT arrangement which is selectively enabled to control the frequency of the local oscillator signal after the PLL has caused the local oscillator signal to have a nominal frequency associated with a selected channel to correct for frequency offsets of the respective RF signal.

Since PLLs for the most part comprise digital circuits and AFT arrangements for the most part comprise analog circuits, respective integrated circuit technologies may not be compatible with each other. As a result, the incorporation of a significant portion of a tuning system including a PLL and an AFT arrangement into a single integrated circuit is hindered. So that a PLL tuning system and AFT provisions for it may be incorporated in a single integrated circuit, the analog AFT arrangement may be replaced by a second phase locked loop configuration for reducing the error between the actual frequency of an IF signal and its desired value due to a frequency offset of a respective RF signal. However, a PLL configuration for the AFT function, because of its digital nature, tends to be more susceptible than analog AFT arrangements to peculiar RF signal conditions such as, e.g., the overmodulation of the RF signal, than analog AFT arrangements. In addition, such PLL AFT configurations may require modification of conventional IF circuits to provide the type of signals which are processed in PLLs. Therefore, there is a need for AFT arrangements which while analog in nature are compatible with integrated circuit technologies for PLLs.

While analog AFT arrangements have advantages over digital AFT arrangements in PLL tuning systems, they tend to be more affected by variations in the gain versus frequency characteristics of the tuning system. Variations of the gain versus frequency characteristics result for the most part because the voltage controlled oscillators typically employed in such tuning systems are appreciably more sensitive to changes of the control voltage in the UHF range than in the VHF range. To account for the relative insensitivity of the local oscillator to changes of the control voltage in the VHF range and still ensure a reasonable response time in the VHF range, time constants associated with the tuning system may be selected to be relatively short. While such selections satisfy the response time requirements in the VHF range, they tend to increase the gain of the tuning system in the UHF range, where the gain is already relatively high, and thereby tend to make the operation of the tuning system in the UHF range approach instability. Therefore, there is a need for apparatus for effectively controlling the sensitivity of a tuning system including an analog AFT arrangement in accordance with the frequency band in which a selected channel resides.

SUMMARY OF THE PRESENT INVENTION

A PLL tuning system embodying the present invention includes a phase comparator means for generating error pulses having polarities and widths representing the sense and magnitude of the phase and/or frequency deviation between a frequency-divided version of a local oscillator signal generated by a controlled oscillator and a frequency reference signal and filter means for generating a control signal for controlling the controlled oscillator to reduce the deviation. Converter means is provided to convert an analog AFT signal having an S-shaped amplitude versus frequency characteristic representing the sense and magnitude of the deviation between the frequency of a predetermined signal component of an IF signal and its desired value to pulses similar to those generated by the phase comparator means but representing the sense and magnitude of the frequency deviation of the predetermined signal component of the IF signal. The AFT representative pulses are selectively coupled to the filter means so that the control signal causes the reduction of the frequency deviation of the predetermined signal component of the IF signal. A significant portion of this arrangement lends itself to incorporation into a single integrated circuit.

In accordance with another feature of the present invention, duty cycle control means controls the duty cycle of the AFT representative pulses in accordance with the selected channel so as to account for variations of the sensitivity of the tuning system to the control signal as a function of frequency.

DETAILED DESCRIPTION OF THE DRAWING

Figure 1:
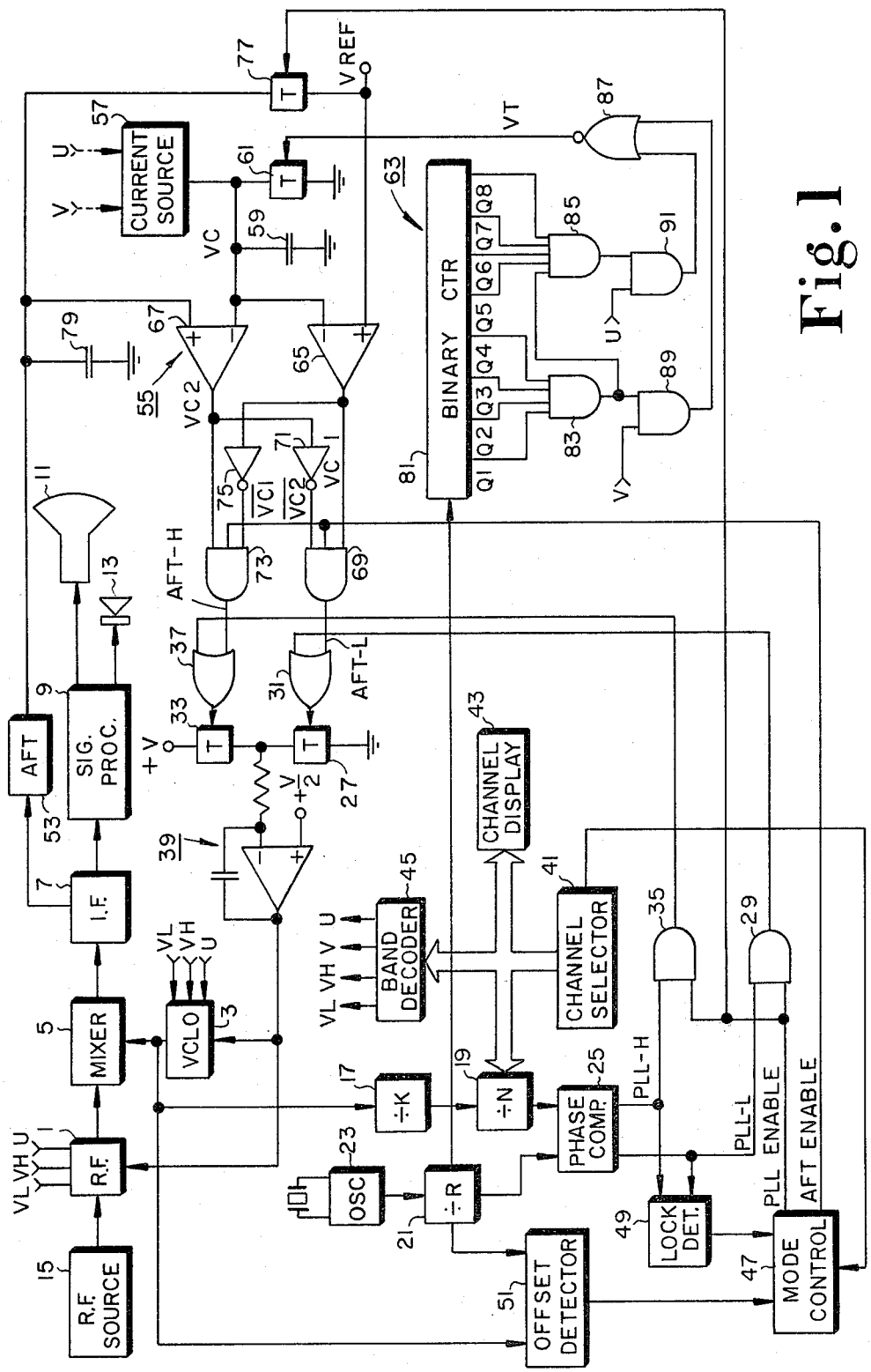
FIG. 1 is a schematic diagram, partially in block form, of a tuning system embodying the present invention as it may be employed in a television receiver.

A television receiver shown in FIG. 1 includes an RF unit 1, a voltage controlled local oscillator (VCLO) 3, a mixer 5 and an IF unit 7 for generating an IF signal having picture and sound components, and a signal processing unit 9, a picture tube 11 and a speaker 13 for developing visible and audible response from the IF components. RF signals are applied to RF unit 1 from an RF signal source 15. RF signal source 15 may be a master antenna or cable installation. Since such installations are not as strictly regulated by the Federal Communications Commission (FCC) as broadcast stations, the RF signals they provide may have nonstandard frequency carriers offset in frequency with respect to respective standard frequency carriers required to be transmitted by broadcast stations.

The tuning system which constitutes the remaining portion of the television receiver shown in FIG. 1 generates a tuning voltage for controlling the frequency of the local oscillator signal generated by VCLO 3 and the frequency response of RF unit 1 so that the receiver can be tuned to nonstandard as well as standard frequency RF carriers. The tuning system included is of the same general type as disclosed in U.S. Pat. No. 4,031,549, hereby incorporated by reference. The tuning system includes a phase locked loop (PLL) configuration for first causing the local oscillator signal to have a nominal frequency corresponding to the standard frequency of the RF carrier for a selected station and an AFT arrangement for thereafter controlling the frequency of the local oscillator signal so as to reduce any deviation between the actual frequency of the carrier of the picture component of the IF signal and its desired or nominal value, i.e., 45.75 MHz, due to an offset of the frequency of the RF carrier.

Figure 2:
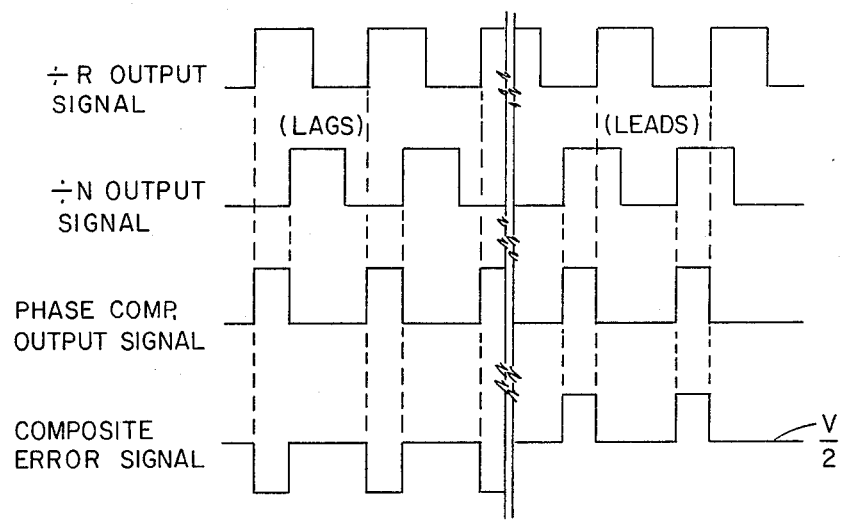
FIGS. 2, 3 and 4 are graphical representations of signal waveforms useful in obtaining an understanding of the present invention.

The PLL configuration includes a fixed frequency divider (÷K) 17, a programmable frequency divider (÷N) 19 for dividing the frequency of the local oscillator signal generated by VCLO 3 to derive a frequency-divided version of the local oscillator signal, a fixed frequency divider (÷R) 21 for dividing the frequency of the output signal of a crystal oscillator 23 to generate a frequency reference signal, and a phase comparator 25 for generating PLL-L and PLL-H error signals representing the phase and/or frequency deviation between the frequency-divided local oscillator signal and the frequency reference signal. With reference to FIG. 2, when the frequency-divided local oscillator signal lags behind the frequency reference signal (due either to a phase or frequency difference, or both), the PLL-L error signal, which is otherwise at a low logic level, includes positive-going pulses having durations substantially equal to the time intervals between respective leading edges of the frequency reference signal and the frequency-divided local oscillator signal. When the frequency-divided local oscillator signal leads the frequency reference signal, the PLL-H error signal, which is otherwise at the low logic level, includes positive-going pulses having durations substantially equal to the time intervals between respective leading edges of the frequency-divider local oscillator signal and the frequency reference signal.

The PLL-L signal is selectively applied to the control input of a transmission (T) gate 27 through an AND gate 29, enabled by a high logic level PLL ENABLE signal (to be discussed below) and an OR gate 31. T gate 27, which is normally nonconductive, is rendered conductive in response to the positive-going pulses of the PLL-L signal. The PLL-H signal is selectively applied to the control input of a T gate 33 through an AND gate 34, also enabled by the PLL ENABLE signal, and an OR gate 37. T gate 33, which is normally nonconductive, is rendered conductive in response to the positive-going pulses of the PLL-H signal. The conduction paths of T gates 27 and 33 are connected in series between a circuit point to which is applied a supply voltage $+V$ and a signal ground point. As T gates 27 and 33 are rendered conductive in response to the respective positive-going pulses applied to their control inputs, a composite error signal having negative-going and positive-going pulses with respect to a voltage level $+V/2$ is developed at the junction of the conduction paths of T gates 27 and 33 as is graphically illustrated in FIG. 2. The positive-going pulses of the composite error signal correspond to the positive-going pulses of the PLL-L error signal. The negative-going pulses of the composite error signal correspond to the positive-going pulses of the PLL-H error signal.

In response to the composite error signal, the magnitude of the tuning voltage for VCLO 3 generated by an active low pass filter or integrator 39 is changed so as to reduce the phase and/or frequency deviation between the frequency reference signal and the frequency-divided local oscillator signal. When the deviation has been minimized, the relationship between the frequency of the local oscillator signal, $f_{LO}$, and the frequency of the crystal oscillator signal, $F_{XTAL}$, are related by the following expression:

$$f_{LO} = NK/R f_{XTAL} \tag{1}$$

The division factors K and R are selected to determine the operating frequency range of the PLL configuration. Desirably, the factor $K/R f_{XTAL}$ is made equal to 1 MHZ, so that the programmable division factor of divider 19, N, is equal, in MHz, to the frequency of the local oscillator signal.

The value of N is controlled in response to binary signals representing in coded format the channel number of the selected channel generated by a channel selector 41. For this purpose, channel selector 41 may include a keyboard (not shown) for generating binary signals representing the two digits of the channel number and a register (not shown) for storing the binary signals. The binary signals representing the selected channel are also applied to a channel number display unit 43 and a band decoder 45. Channel number display unit 43 may, e.g., include two seven-segment arrays of light-emitting diodes for displaying the channel number of the selected channel. Band decoder 45 determines the frequency band in which the selected channel resides in response to the binary signals representing the channel number of the selected channel and generates a VL signal when the selected channel is in the low VHF band, i.e., channels 2 through 6; a VH signal when the selected channel is in the high VHF band, i.e., channels 7–13; and a U signal when the selected channel is in the UHF band, i.e., channels 14–83.

The VL, VH and U signals control the selection of respective inductors (not specifically shown) of tuned circuits (not specifically shown) of RF unit 1 and VCLO 3 to control the tuning range of the tuned circuits. Each tuned circuit, e.g., includes a voltage variable capacitance or varactor diode which determines the center frequency of the tuned circuit in response to the tuning voltage generated by low pass filter 39.

The operation of the PLL configuration is initiated by a mode control unit 47 when a new channel is selected by means of channel selector 41. Specifically, when a new channel is selected, mode control unit 47 generates a high logic level PLL ENABLE signal which enables AND gates 29 and 35 to apply the PLL-L and PLL-H signals to T gates 27 and 33, respectively. When the deviation between the frequency-divided local oscillator signal and frequency reference signal has been substantially minimized, the pulses of the PLL-L and PLL-H error signals will have relatively short durations. The occurrence of this condition is detected by a lock detector 49. In response, mode control unit 47 causes the PLL ENABLE signal to have a low logic level which disables AND gates 29 and 35 and thereby terminates the operation of the PLL configuration. At the same time, mode control unit 47 causes a high logic level AFT ENABLE signal to be generated. The high logic AFT ENABLE signal causes the initiation of the operation of the AFT arrangement to be discussed below.

Should, at any time after the initiation of the AFT arrangement, the frequency of the local oscillator signal be offset from the nominal value associated with the standard frequency RF carrier for the respective selected channel by more than a predetermined amount, e.g., 1.25 MHz, an offset detector 51 generates a signal indicating the condition. In response, mode control unit 47 causes the operation of the AFT arrangement to be terminated by causing the AFT ENABLE signal to have the low logic level and again initiates the operation of the PLL configuration by causing the PLL ENABLE signal to have the high logic level. Local oscillator frequency offsets greater than 1.25 MHz are to be avoided since such offsets approach the separation between the frequency of the picture carrier (i.e., 45.75 MHz in the IF range) of the present channel and the frequency of the sound carrier of the lower adjacent channel (i.e., 47.25 MHz in the IF range).

Various portions of the tuning system so far described may be implemented in the same manner as corresponding portions of the tuning system shown in the aforementioned U.S. patent. In addition, RCA Solid State Division Application Note ICAN-6101 published in the RCA Solid State 1974 Databook Series SSD-203B by RCA Corporation, Somerville, New Jersey, hereby incorporated by reference, also discloses a phase comparator known as "Phase Comparator II" suitable for use as phase comparator 25.

Figure 3:
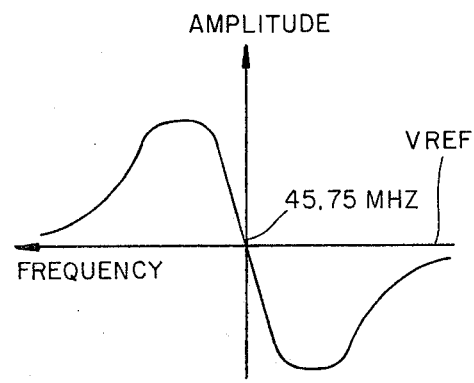

The AFT arrangement includes an AFT discriminator 53 of the conventional type for generating a voltage VAFT having an S-shaped amplitude versus frequency characteristic as is graphically illustrated in FIG. 3. The AFT characteristic has both positive and negative amplitude portions with respect to a reference voltage level VREF. The S-shaped characteristic crosses the VREF level at a point corresponding to the nominal frequency, i.e., 45.75 MHz, of the IF picture carrier. A converter 55 converts analog voltage VAFT into AFT-H and AFT-L pulse error signals representing the deviation of the actual frequency of the picture carrier from 45.75 MHz. The AFT-H error signal includes pulses having durations corresponding to positive deviations of the frequency of the IF picture carrier from 45.75 MHz. The AFT-L error signal includes pulses having durations corresponding to negative deviations of the frequency of the IF picture carrier from 45.75 MHz.

During the following description of converter 55, reference to both FIGS. 1 and 3 will be helpful.

Figure 4:
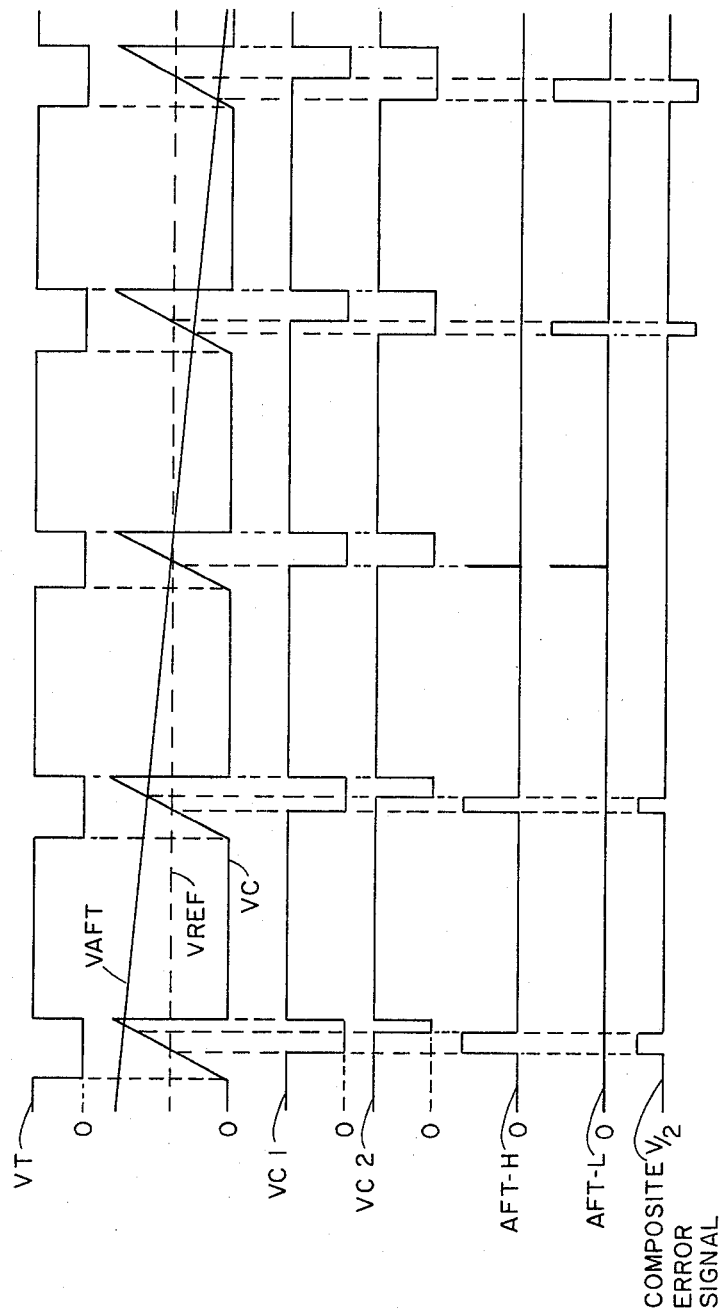

Converter 55 includes a current source 57 for generating a current for selectively charging a capacitor 59 to develop a voltage VC. A normally conductive T gate 61, which shunts capacitor 59, is rendered nonconductive during negative-going pulses of a trigger signal VT generated by a trigger circuit 63. As a result, during the negative-going pulse of VT, voltage VC has a ramp portion which increases as a function of time. If the current supplied by current source 57 is substantially constant, the ramp portion of VC is substantially linear as indicated in FIG. 4.

The magnitude of voltage VC is compared to a voltage substantially equal to the voltage reference level VREF of the AFT characteristic by a voltage comparator 65. The magnitude of voltage VC is also compared to the AFT voltage VAFT by a voltage comparator 67. The voltage VC1 developed at the output of comparator 65 includes negative-going pulses having leading edges at times when the ramp portion of voltage VC has a magnitude substantially equal to the magnitude of the voltage reference level VREF. The voltage VC2 developed at the output of comparator 67 includes negative-going pulses having leading edges at times when the ramp portion of voltage VC has a magnitude substantially equal to the magnitude of the voltage VAFT.

An inverter 71 generates the complement, $\overline{VC2}$, of VC2. An inverter 75 generates the complement, $\overline{VC1}$, of VC1. An AND gate 69, when enabled by a high level AFT ENABLE signal, combines $\overline{VC1}$ and VC2 to form the AFT-L error signal. As is indicated in FIG. 4, the AFT-L error signal includes positive-going pulses having durations corresponding to negative differences between the magnitude of VAFT and VREF. An AND gate 73, when enabled by a high logic level AFT ENABLE signal, combines VC1 and $\overline{VC2}$ to form the AFT-H error signal which includes positive-going pulses having durations corresponding to positive differences between the magnitude of VAFT and VREF.

The AFT-L and AFT-H error signals are applied to T gates 27 and 33 through OR gates 31 and 37, respectively. As a result, a combined error signal having negative-going pulses with durations corresponding to the magnitude of negative deviations of the frequency of the IF picture carrier from 45.75 MHz and the positive-going pulses with durations corresponding to the magnitude of positive deviations of the frequency of the IF picture carrier from 45.75 MHz. Low pass filter 39 responds to the combined pulse error signal derived from the output signal of AFT discriminator 53 to control the magnitude of the tuning voltage so as to reduce the deviation of the frequency of the IF picture carrier from 45.75 MHz.

During the operation of the PLL configuration, a T gate 77 is conductive in response to the high logic level of the PLL ENABLE signal. As a result, a voltage substantially equal to VREF is applied across a capacitor 79 which shunts the output of AFT discriminator 53 and VAFT is maintained substantially equal to VREF. When the operation of the AFT arrangement is initiated, T gate 77 is rendered nonconductive in response to the low logic level of the PLL ENABLE signal. Since the voltage across a capacitor cannot change instantaneously, VAFT is initially substantially equal to VREF. As a result, the initial frequency offset of the local oscillator signal due to switching anomalies affecting VAFT when the operation of the AFT arrangement is initiated is kept from exceeding the predetermined frequency offset at which the operation of the PLL would be reinitiated. In the absence of such provisions, the tuning system could undesirably reach a lockout condition in which it cyclically switches between PLL and AFT operations.

As referred to above, RF unit 1 and VCLO 3 have different voltage controlled tuned circuits for different frequency bands. The sensitivities (sensitivity being a measure of the change in tuning voltage required for a given change in frequency) of the tuned circuits tend to differ. The response time of the AFT arrangement depends to a large extent on the sensitivity of the tuned circuit of VCLO 3 which has been selected. Because the sensitivities of the tuned circuits for the low and high VHF bands are much less than the sensitivity of the tuned circuit for the UHF band, the response times for VHF channels are longer than the response times for UHF channels. For example, a ratio of 1 to 16 between the respective response times is possible. While low pass filter 39 as well as other components of the AFT arrangement may be selected to provide shorter response times for VHF channels, such changes also affect the stability of the AFT arrangement. In the UHF range, such changes may cause a critical instability.

In the tuning system shown in FIG. 1, trigger unit 63 is arranged to change the duty cycle of VT to effectively equalize tuning sensitivities in the VHF and UHF ranges. Specifically, trigger unit 63 includes a binary counter 81 for dividing the frequency of a clock signal, generated by a stage of divider 21, by successive powers of 2 to generate respective Q1 through Q8 pulse output signals. An AND gate 83 combines the Q1 through Q4 output signals of binary counter 81 and an AND gate 85 combines the output signal of AND gate 83 with the Q5 through Q8 output signals of binary counter 81. The output signals of AND gates 83 and 85 both include positive-going pulses having the same duration. However, since the frequency of the output signal of AND gate 83 is 16 times greater than the frequency of the output signal of AND gate 85, the duty cycle (i.e., the ratio of the duration of the positive-going pulse in a cycle to the duration of the cycle) of the output signal of AND gate 83 is 16 times greater than the duty cycle of the output signal of AND gate 85.

When a channel in the VHF range is selected, the output signal of AND gate 83 is applied to a NOR gate 87 through an AND gate 89 enabled in response to a V band selection signal generated by band decoder 45. NOR gate 87 inverts the output signal of AND gate 83 and applies it to T gate 61. Similarly, when a channel in the UHF range is selected, an inverted version of the output signal of AND gate 85 is applied to T gate 61 by means of an AND gate 91, enabled by a band selection signal and NOR gate 87. Since the duty cycle of the trigger signal applied to T gate 61 for VHF channels has a duty cycle 16 times greater than the duty cycle of the trigger signal applied to T gate 61 for UHF channels, the tuning voltage generated by low pass filter 39 is modified according to the conditions of VAFT approximately 16 times faster in the VHF range than in the UHF range. Accordingly, the sensitivity of the tuning system to the changes in the tuning voltage is more uniform throughout the tuning range.

Other arrangements for compensating for the different sensitivities of the tuning system may be employed. For example, the current supplied by current source 57 to capacitor 59 may be controlled in accordance with the selected channel. Specifically, the current supplied by current source 57 may be increased for UHF channels with respect to the current supplied for VHF channels in response to U and V band selection signals as is indicated by the respective phantom conductors to current source 57. The effect of an increased charging current is to increase the slope of the ramp portion of VC and thereby decrease the duty cycles of the output signals generated by comparators 67 and 65 and the composite error signal applied to low pass filter 39 and thereby decrease the rate of change of the tuning voltage.

Figure 5:
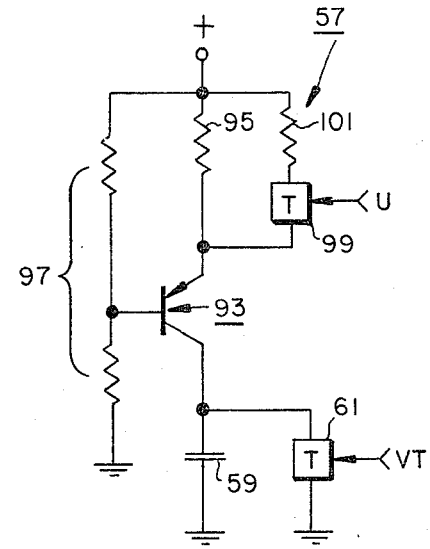
FIG. 5 is a schematic diagram of an implementation of a portion of the tuning system shown in block form in FIG. 1.

The current source shown in FIG. 5 is suitable for the above-mentioned purpose. The magnitude of the output current flowing through the collector-to-emitter path of a PNP transistor 93 is essentially determined by the voltage established across an emitter resistor 95 by a voltage divider 97 coupled to the base of transistor 93. A T gate 99 is rendered conductive in response to a U band selection signal so as to shunt resistor 95 with a resistor 101. As a result, the output current is increased.

Since capacitor 59 may have a relatively small value and since current source 57 and comparators 65 and 67 may comprise bipolar circuits compatible with digital logic elements comprising $I^2L$ (integrated injection logic) circuits, a substantial portion of the tuning system shown in FIG. 1 may be included within a single integrated circuit.

While the tuning system described above has been arranged to distinguish between channels in the VHF band and channels in the UHF band for compensating for their respective different sensitivities, it is of course also possible to arrange the tuning system to distinguish between channels in respective portions of a band and even between individual channels. Furthermore, while specific logic implementations have been disclosed, it is of course possible to employ other logic implementations for the same function. These and other modifications are contemplated to be within the scope of the present invention as defined by the following claims.

I claim:

1. Apparatus for tuning a receiver to the RF signal associated with a selected channel, comprising:

controlled oscillator means for generating a local oscillator signal having a frequency controlled in response to a tuning control signal;

mixer means for combining said RF signal and said local oscillator signal to generate an IF signal, the frequency of said IF signal having a nominal value;

frequency divider means for dividing the frequency of said local oscillator signal by a factor related to said selected channel to generate a frequency-divided signal;

frequency reference means for generating a frequency reference signal;

phase comparator means for generating first and second error signals including pulses with durations representing the magnitudes of respective opposite deviations of at least one of the phases and frequencies of said frequency-divided signal from said frequency reference signal;

tuning control means responsive to said first and second error signals for generating said tuning control signals so as to reduce the deviations of said frequency-divided signal from said frequency signals;

discriminator means response to said IF signal for generating an AFT signal having an amplitude versus frequency characteristic with amplitudes above and below a reference amplitude representing the magnitudes of respective opposite deviations between the frequency of said IF signal and said nominal value;

pulse converter means for generating third and fourth error signals including pulses with durations corresponding to respective opposite deviations between the amplitude of said AFT signal and said reference amplitude; and mode control means for selectively enabling said tuning control means to be responsive to said third and fourth error signals so as to reduce the deviations between said IF signal and said nominal value.

2. The apparatus recited in claim 1 wherein:
said converter means includes ramp generator means for selectively generating a ramp signal having a ramp-like amplitude versus time characteristic; first comparator means for generating a first output signal selectively having either a first or a second amplitude level dependent on the relative magnitudes of said ramp-like signal and said reference amplitude; second comparator means for generating a second output signal selectively having either a first or a second amplitude level dependent on the relative magnitudes of said ramp-like signal and said AFT signal; and combining means for combining said first and second output signals to generate said third and fourth error signals.

3. The apparatus recited in claim 2 wherein:
said converter means includes initialization means for causing said AFT signal to have an amplitude substantially equal to said reference amplitude when said control means is initially enabled to be responsive to said third and fourth error signals.

4. The apparatus recited in claim 2 wherein: said ramp generator means includes capacitor means; current source means for selectively coupling a charging current to said capacitor means to charge said capacitor means and thereby generate said ramp signal; and charging control means for selectively enabling said current source means to charge said capacitor means.

5. The apparatus recited in claims 1 or 4 wherein: said converter means includes duty cycle control means for controlling the duty cycles of the pulses of said third and fourth error signals in accordance with said selected channel.

6. The apparatus recited in claim 5 wherein: said duty cycle control means causes the duty cycles of the pulses of said third and fourth error signals to be smaller when said selected channel is in the UHF range than when said selected channel is in the VHF range.

7. The apparatus recited in claim 4 wherein:
said charging control means includes counter means for generating enabling pulses for enabling said current source means to charge said capacitor means; and said counter means includes frequency control means for controlling the frequency of said enabling pulses in accordance with the frequency of the RF signal associated with said selected channel.

8. The apparatus recited in claim 7 wherein:
said frequency control means causes frequency of said enabling pulses to be lower when said selected channel is in the UHF range than when said selected channel is in the VHF range.

9. The apparatus recited in claim 4 wherein:
said ramp generator means includes charging rate control means for controlling the charging rate of said capacitance means in accordance with the frequency of the RF signal associated with said selected channel.

10. The apparatus recited in claim 9 wherein:
said charging rate control means causes the charging rate of said capacitance means to be greater when said selected channel is in the UHF range than when said selected channel is in the VHF range.

11. The apparatus recited in claim 10 wherein:
said charging rate control means includes charging current control means for causing said charging current to have a greater magnitude when said selected channel is in the UHF range than when said selected channel is in the VHF range.

* * * * *

UNITED STATES PATENT AND TRADEMARK OFFICE
CERTIFICATE OF CORRECTION

PATENT NO. : 4,245,351

DATED : January 13, 1981

INVENTOR(S) : Juri Tults

It is certified that error appears in the above—identified patent and that said Letters Patent is hereby corrected as shown below:

| | |
|---|---|
| Column 3, line 57, | "34" should be --35--. |
| Column 4, line 23, | "MHZ" should be --MHz--. |
| Column 6, line 15, | "VC2" should be --$\overline{VC2}$--. |
| Column 6, line 16, | "VC1" should be --$\overline{VC1}$--. |
| Column 6, line 18, | "VC2" should be --$\overline{VC2}$--. |
| Column 6, line 24, | "VC1" should be --$\overline{VC1}$--. |

Signed and Sealed this

Twenty-first Day of July 1981

[SEAL]

Attest:

Attesting Officer

GERALD J. MOSSINGHOFF

Commissioner of Patents and Trademarks